March 29, 1966 D. W. DODGE 3,243,709
ALL-TRANSISTOR PUSH-BUTTON RADIO RECEIVER
Filed Nov. 21, 1960
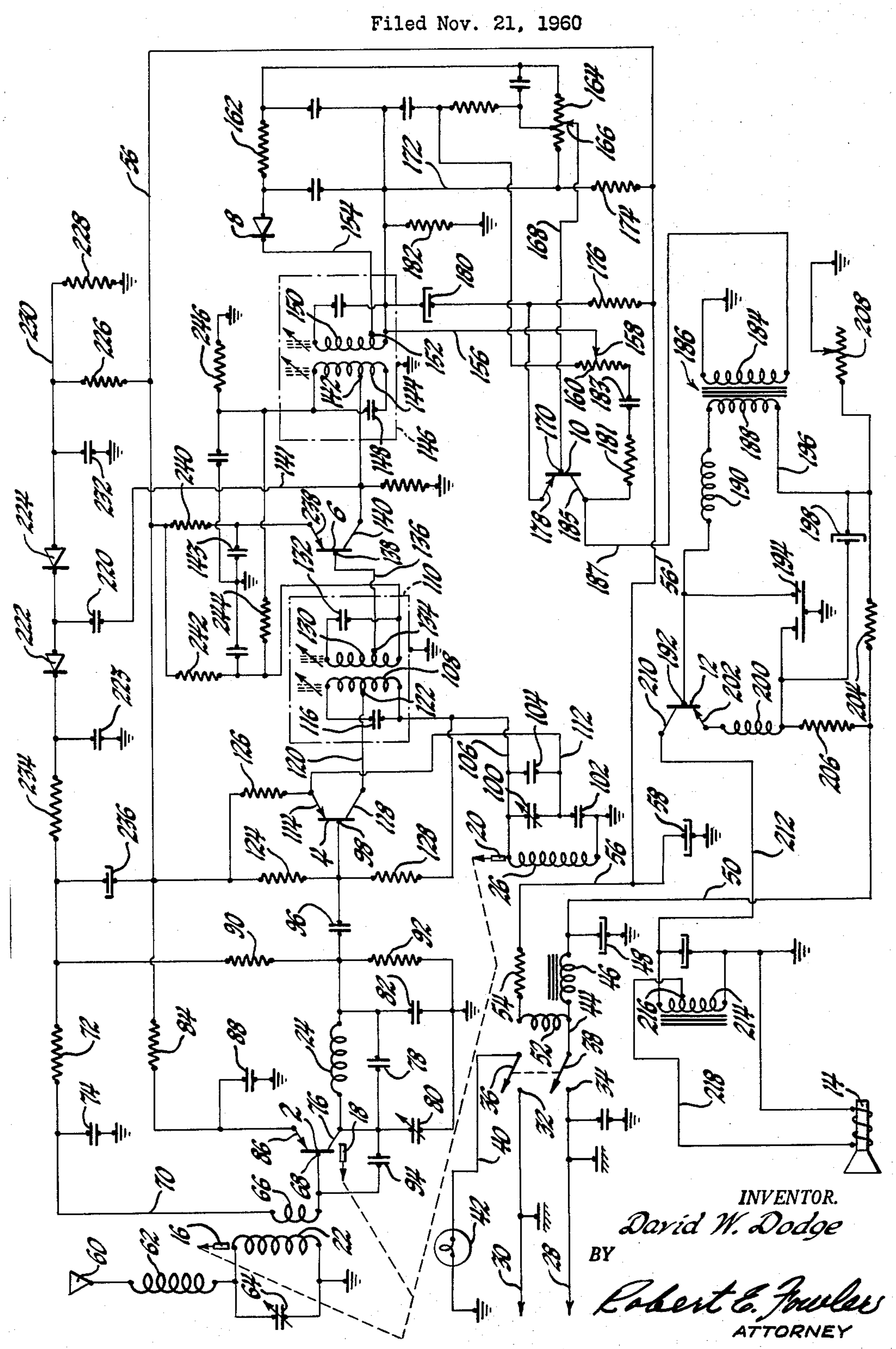
INVENTOR.
David W. Dodge
BY
Robert E. Fowler
ATTORNEY

3,243,709
ALL-TRANSISTOR PUSH-BUTTON RADIO RECEIVER

David W. Dodge, Kokomo, Ind., assignor to General Motors Corporation, Detroit, Mich., a corporation of Delaware Filed Nov. 21, 1960, Ser. No. 70,613
3 Claims. (Cl. 325—319)

This invention relates to transistorized radio signal receiving means and more particularly to means for developing and applying automatic gain or volume control voltages to a transistorized radio signal receiving means.

It is an improvement over the automatic gain or volume control systems for transistorized radio signal receiving means shown in S.N. 704,139, Guyton and Scott, filed December 20, 1957, now U.S. Patent No. 2,983,815 issued May 9, 1961 and S.N. 826,820, Leslie E. Scott, filed July 13, 1959, now U.S. Patent No. 2,961,534 issued Nov. 22, 1960 all assigned to a common assignee.

The problem of developing and applying an adequate automatic gain control voltage to a prior amplifying stage in a transistorized radio receiver is somewhat different from that problem as applied to a radio receiver utilizing vacuum tubes. In most instances it has been necessary in the transistorized versions to provide some amplifying means to obtain an adequate control signal. In other cases control voltages have been simultaneously applied to more than one electrode of a transistor amplifier in order to provide proper control.

It is an object in making this invention to provide an effective automatic gain control circuit for a transistorized amplifying circuit.

It is a further object in making this invention to provide an automatic gain control system for transistorized amplifying means that utilizes a voltage doubler section for obtaining adequate signal strength.

It is a further object in making this invention to provide an automatic gain control system for transistorized amplifying means that consumes a minimum amount of power, becomes active quickly upon energization of the receiver and provides substantially linear response.

With these and other objects in view which will become apparent as the specification proceeds, my invention will be best understood by reference to the following specification and claims and the illustrations in the accompanying drawing, in which:

The figure is a circuit diagram of a transistorized radio receiver embodying my novel automatic gain control system.

Referring now more particularly to the drawings, the circuit shown contains generally a radio frequency amplifying stage including transistor 2, a mixer stage including a transistor 4, an intermediate frequency amplifying stage including transistor 6, a detector diode 8, an AF driver amplifying stage including transistor 10, and a final audio frequency power amplifier stage including transistors 10 and 12 which feed into a loud speaker 14 for converting the electrical oscillations into audible vibrations.

The receiver is of the permeable tuned type and, as diagrammatically illustrated, the three comminuted iron cores 16, 18 and 20 are shown moving simultaneously by dashed lines connecting the same as they tune the coils 22, 24 and 26 of the antenna, RF and oscillator circuits respectively. The receiver is of the type which is adapted to be operated from a direct current voltage source such as the storage battery of an automobile and both input lines 28 and 30 are connectible to a source of direct current power. Line 30 is connected to a stationary terminal 32 of a double pole, single throw switch and line 28 is connected to spaced stationary terminal 34 of the same switch. The movable switch arms 36, 38 of the double pole, single throw switch are mechanically ganged to move together but electrically insulated from each other. Movable arm 36 is connected through line 40 to an indicating light 42 the opposite terminal of which is grounded. Whenever this switch, therefore, is closed the light will be energized indicating energization of the set. The opposite arm 38 is designed to engage stationary contact 34 and when it does so, applies electrical power to the main set through line 44. Line 44 is connected to one terminal of a choke coil 46 which forms part of a filter circuit and in conjunction with a condenser 48 filters the power applied to line 50 which extends from the other terminal of choke 46 to supply power to the power output stage including transistor 12. In similar manner power line 44 is also connected through coil 52 and a resistance 54 in series therewith to a power supply line 56 which is connected to supply power to various other portions of the radio receiver. A filter condenser 58 is connected between power line 56 and ground.

An antenna 60 is connected through a coil 62 in series therewith and through a tuned input circuit to ground. The tuned input circuit consists of a first tunable coil 22 having in parallel therewith an adjustable condenser 64. The condenser is factory adjusted to give the proper range and the actual tuning of this stage is accomplished through the movement of a comminuted iron core 16 which is inserted into or withdrawn from the coil for tuning the set over the band. Coil 22 is a primary winding and has associated therewith a secondary winding 66, one terminal of which is connected directly to base electrode 68 of the RF transistor 2 to apply input signals to this stage. The other terminal of secondary coil 22 is connected through line 70 to a limiting resistor 72 whose purpose will later be explained. A by-pass condenser 74 is connected between line 70 and ground. Collector electrode 76 of the RF transistor 2 is connected directly to the RF tunable circuit including coil 24 and its associated parallel condenser 78. A comminuted core 18 tunes coil 24 over the band. An adjustable condenser 80 is connected directly from the collector to ground and a condenser 82 is connected directly from the opposite end of the tuning coil 24 to ground. The main power line 56 is connected through a limiting resistor 84 to the emitter electrode 86 of the RF transistor 2 and a by-pass condenser 88 is connected from the emitter to ground. A resistance 90 is connected between one terminal of the tuning coil 24 and the remaining terminal of the resistance 72. This provides a negative direct current feedback path from the collector to the base of the RF transistor 2 which makes it possible to make use of and replace commercial transistors at this location which might have differing characteristics without altering the operation. A resistance 92 is connected between one terminal of tuning coil 24 and ground. Another improvement in this circuit is the use of a small condenser 94 which is directly connected between the collector 76 and the base 68. This provides for a more linear response at near zero bias and cuts down on distortion in the operation of this amplifier stage.

The output of the first RF amplifying stage is connected through a coupling condenser 96 to the base electrode 98 of the mixer transistor 4. In this stage the incoming high frequency is mixed with a locally generated lower frequency to obtain the intermediate frequency modulated signal. To provide a locally generated frequency an oscillator is provided and this includes the tunable oscillator coil 26 across which are connected two condensers 100 and 102 in series, the first condenser 100 being adjustable. A third condenser 104 is connected in shunt with the adjustable condenser 100. This oscillator circuit has one terminal connected through line 106 to the lower end of the primary winding 108 of the first IF transformer 110. The junction of capacitors 100 and 102 of this oscillator circuit is connected through conductor 112 to the emitter electrode 114 of the transistor 4. A condenser 116 is connected across primary 108 to tune this winding to the intermediate frequency. The collector electrode 118 of the transistor 4 is connected through line 120 to a tap 122 on the primary winding 108. Thus the output of transistor 4 is fed into intermediate frequency coupling transformer 110 and the frequency generated in the autodyne converter is mixed with the incoming frequency received on the antenna by the connection of the autodyne converter tank circuit to emitter electrode 114 of transistor 4. A biasing resistor 124 is connected between power line 56 and base electrode 98 of transistor 4 and finally a second biasing resistor 126 is connected between the power line 56 and emitter electrode 114. Resistance 128 is connected between the base electrode 98 and line 106 to one side of the oscillator tuned circuit.

The intermediate frequency signal injected into the primary winding 108 of the first IF transformer 110 induces a similar signal in the secondary winding 130 of the transformer which is similarly tuned by condenser 132 connected thereacross to the intermediate frequency. The output of the secondary is taken off at tap 134 and applied through conductor 136 to the base electrode 138 of intermediate frequency amplifier transistor 6. This amplified intermediate frequency signal is now taken from this stage through collector electrode 140 and applied to a tap 142 on primary winding 144 of the second IF transformer 146. The primary is tuned to the intermediate frequency by a condenser 148 connected thereacross. Secondary winding 150 of the second IF transformer 146 has a tap 152 thereon which is connected through line 154 to detect diode 8 wherein the signal is detected and applied to the audio frequency amplifying section. The lower terminal of the secondary 150 is connected through line 156 to an adjustable tap 158 on resistor 160. Resistance 162 has one terminal connected directly to the detector diode 8 and its remaining terminal connected to one end of a resistance 164. Resistance 164 acts as the volume control and an adjustable tap 166 movable thereover is connected through line 168 directly to the base electrode 170 of the driver stage transistor 10 to apply the detected signal thereto. The remaining terminal of resistance 164 is connected through line 172 to the lower end of secondary winding 150 and to one end of a biasing resistance 174 connected to the power line 56. A biasing resistance 176 is connected between the power line 56 and the emitter electrode 178 of the driver transistor 10 to provide emitter bias. Condenser 180 is connected between line 156 and the emitter 178 and biasing resistance 182 is connected between line 172 to ground to complete a voltage divider section. A resistance 181 in series with condenser 183 is connected from one terminal of resistance 160 to collector 185 of transistor 10.

The output from the AF driver stage is taken off from the collector electrode 185 of the transistor 10 and applied through conductor 187 to the primary 184 of a coupling transformer 186, the opposite terminal of which is grounded. The secondary winding 188 of the coupling transformer 186 has the upper terminal connected through an inductance coil 190 to the base electrode 192 of the power transistor 12. A condenser 194 is connected between base electrode 12 and ground as a portion of a filter circuit. The remaining terminal of the power transformer 188 is connected through conductor 196 and bypass condenser 198 to one terminal of a coil 200 connected to the emitter electrode 202 of the power transistor. Two resistances in series, 204 and 206, are connected in shunt around the bypass condenser 198. A variable resistance 208 is connected between line 196 and ground to vary the bias on emitter electrode 202. After final amplification in the power transistor stage the output signal is taken from the collector electrode 210 and applied directly through line 212 to autotransformer winding 214 the opposite end of which is grounded. A tap 216 on this winding is connected directly to the loud speaker 14 through line 218.

Returning now to a consideration of the development of the AGC signal, this is taken off from the collector electrode 140 of the transistor 6 and applied through a coupling condenser 220 to a location between two diodes 222 and 224 which form a voltage doubler circuit. The power line 56 is connected to ground through a pair of of resistances 226 and 228 in series which form a voltage divider and develop a desired potential on line 230 which is connected to diode 224. A bypass condenser 232 is connected between line 230 and ground. This provides a novel biasing arrangement for the voltage doubler from the main power line 56 to ground so that less power is consumed in the AGC system. The lefthand terminal of the diode 222 is connected through limiting resistance 234 to resistance 72 so that any AGC voltage developed in the voltage doubler section can be applied through resistance 234 and resistance 72 directly to the base electrode 68 of the RF transistor 2. By using the voltage doubler in series with the power supply voltage divider, part of the bias for the RF transistor is supplied from a source which does not draw current through the AGC diodes and with lower diode current in the forward direction the diode resistances are higher and there is less power taken from the IF stage at very low signal levels. Further, since some of the bias is supplied by the voltage divider 228–226, resistance 90 in the collector circuit is necessarily larger and less AGC power is consumed in it.

The emitter electrode 238 of the transistor 6 is provided with the proper bias through biasing resistance 240 connected between the power line 56 and emitter electrode. Also a biasing resistor 242 is connected between the power line and the lower terminal of the secondary 130 of the first IF transformer 110. Two additional resistors 244 and 246 are connected in series between the lower terminal of resistance 242 and ground to provide a further biasing voltage for the collector electrode 140.

In order to describe the operation of the AGC circuit it is first desired to define certain circuits that are existent for required purposes. The IF signal which is to be used for AGC purposes is taken from the collector electrode 140 of the transistor 6. The power line 56 is at B+ voltage, for example +12 volts. The value of the resistors 226 and 228 are so chosen that line 230 is at only a slightly lower voltage from that of the power line 56. There are two A.C. paths from collector electrode 140 and current flows alternately through one or the other depending upon the polarity of the signal wave. When the signal volatge is negative the diode 224 conducts and a circuit is completed from ground through condenser 143, emitter 238, collector 140, line 141, condenser 220, diode 224 to line 230 to charge the condenser. On the other half cycle when the signal voltage is positive the circuit is the same from ground to condenser 220 but then diode 222 conducts and the circuit is completed through that diode and condenser 220 discharges. Through these A.C. circuits a positive voltage is developed at the lefthand side of the two diodes and applied to the base 68 of transistor 2.

The signal current rectified by the diodes to effect AGC flows through the following circuit; diode 224, diode 222, resistance 234, resistance 72, line 70, coil 66, base electrode 68, emitter electrode 86, resistance 84, resistance 226 to line 230. Forward bias is applied to base electrode 68 at zero signal through this circuit by the voltage appearing on line 230 due to the voltage divider formed by resistances 226 and 228 in series between the main power line 56 and ground. The forward bias voltage on base 68 is developed at a point between resistances 234 and 72 by current flow through the following circuit; from line 230 through diode 224, diode 222, resistance 234, resistance 90, resistance 92 to ground. This applies a positive voltage to base 68 that is less than the positive voltage on emitter 86. The forward bias current and the rectified currents from the signal flow in opposite directions through the elements of the base and emitter circuits and produce opposing effects. The rectified signal currents tend to make the base electrode 68 more positive or to turn the transistor off. Forward bias current, however, tends to make the base negative turning the transistor on. Since the two effects are opposite, in the present design, they are equal and give zero bias at a given input which, for example, may be at 20K micro volts input to the antenna. For larger signals the transistor tends to turn off and for smaller turn on.

From the above it will be evident that the voltage on line 230 is the reference voltage. The AGC voltage is developed in the voltage doubler circuit by the alternate charging and discharging of condenser 220 which charges on the negative cycles when diode 224 conducts and discharges on the positive cycles when diode 222 conducts. The control voltage developed at the left-hand side of diode 222 controls the base bias of the RF transistor 2. The voltage rise is a linear function of the IF signal amplitude on the collector 140. Resistance 234 and condenser 236 act as a filter for the AGC line. It is to be noted that part of the bias for the RF transistor 2 is provided by voltage divider 226–228 and does not draw current through the diodes. Thus less power is taken from the IF stage. RF transistor 2 is further biased by the voltage divider formed by diodes 222 and 224, resistor 234, and resistors 90 and 92 in series. Resistor 90 is large to reduce the amount of AGC power consumed in it. This system also provides a D.C. negative feedback circuit from collector 76 to base 68 of transistor 2 through the resistance 90. This reduces AGC characteristic variations due to variations in diodes used over the full range of operation and, therefore, permits use of commercial components for replacement without disturbing the balance of the system.

In order to provide a quick filter action upon initial energization of the set the AGC filter capacitor 236 is returned to the A power line 56 instead of the ground. This prevents the audio from coming on loudly until the capacitor has charged from zero to, for example, 12 volts. During such charging period the radio was operating without AGC. However, by tying this condenser to the power line the charging voltage is reduced to a small value.

The addition of condenser 94 from base 68 to collector 76 decreases the distortion at small emitter-base bias values of transistor 2 with large modulation. A large part of the signal may thus be fed through the capacitor at these values and maintain less distortion.

What is claimed is:

1. In radio receiving means having transistorized radio frequency, mixer, and intermediate frequency amplifying stages connected in cascade said radio frequency amplifying means having an input and an output circuit and said intermediate frequency amplifying stage having an output circuit, antenna means connected to the input circuit of the radio frequency amplifying means to apply a signal thereto, a degenerative feedback circuit including a voltage doubler connected between the output circuit of the intermediate frequency amplifying means and the input circuit of the radio frequency amplifying means to apply an amplified control signal back to the input for automatic gain control purposes, resistance biasing means connected from the degenerative feedback circuit to ground to bias the input of the radio frequency amplifying means, said resistance biasing means also being connected to said radio frequency output circuit for developing stabilizing feedback.

2. In radio receiving means having transistorized radio frequency, mixer, and intermediate frequency amplifying stages connected in cascade, said radio frequency amplifying means having an input and an output circuit and said intermediate amplifying stage having an output circuit, antenna means connected to the input circuit of the radio frequency amplifying means to apply a signal thereto, a source of electrical power, voltage divider means connected to said source of electrical power and having taps at which different potentials are developed, voltage doubler means connecting one of the taps on the voltage divider with the input circuit of the radio frequency amplifier, capacitative reactance means interconnecting the output circuit of the intermediate frequency amplifying means to the voltage doubler means to apply a control signal to the voltage doubler means which is fed back to the radio frequency amplifying means to control the gain, resistance means connected to the voltage doubler means and to ground, said voltage divider means applying a fixed bias to the radio frequency amplifying means through the voltage doubler circuit said resistance means also being connected to the output of the radio frequency amplifying means to provide a negative feedback path.

3. In radio receiving means having transistorized radio frequency, mixer, and intermediate frequency amplifying stages connected in cascade said radio frequency amplifying means having an input and an output circuit and said intermediate amplifying stage having an output circuit, antenna means connected to the input circuit of the radio frequency amplifying means to apply a signal thereto, a source of electrical power, voltage divider means connected to said source of electrical power and having taps at which different potentials are developed, voltage doubler means connecting one of the taps on the voltage divider with the input circuit of the radio frequency amplifier, capacitative reactance means interconnecting the output circuit of the intermediate frequency amplifying means to the voltage doubler means to apply a control signal to the voltage doubler means which is fed back to the radio frequency amplifying means to control the gain, said voltage divider means applying a fixed bias through the same circuit, and capacitor means connected across the output circuit of the radio frequency amplifying stage to provide a capacity bypass for forward conductance near zero bias with large signal input to avoid distortion in the output signals.

References Cited by the Examiner

UNITED STATES PATENTS

| | | | |
|---|---|---|---|
| 2,135,556 | 11/1938 | Beanland | 250—20 |
| 2,222,759 | 11/1940 | Burnside | 250—20 |
| 2,288,434 | 6/1942 | Bradley | 250—20 |
| 2,531,935 | 11/1950 | Doelz | 250—20 |
| 2,892,932 | 6/1959 | Layburn et al. | 250—20 |
| 3,089,087 | 5/1963 | Birkenes | 325—319 |

ROBERT H. ROSE, *Primary Examiner.*

SAMUEL B. PRITCHARD, ROY LAKE, DAVID G. REDINBAUGH, *Examiners.*

W. J. SIMMONS, E. C. MULCAHY, R. S. BELL, *Assistant Examiners.*